United States Patent
Gauthier

(10) Patent No.: US 9,383,414 B2
(45) Date of Patent: Jul. 5, 2016

(54) METHOD OF DIAGNOSING A BLOCKED HEAT EXCHANGER

(71) Applicant: Atieva, Inc., Redwood City, CA (US)

(72) Inventor: Jean-Philippe Gauthier, San Francisco, CA (US)

(73) Assignee: ATIEVA, INC, Menlo Park, CA (US)

( * ) Notice: Subject to any disclaimer, the term of this patent is extended or adjusted under 35 U.S.C. 154(b) by 105 days.

(21) Appl. No.: 14/473,007

(22) Filed: Aug. 29, 2014

(65) Prior Publication Data

US 2016/0061899 A1  Mar. 3, 2016

Related U.S. Application Data

(63) Continuation-in-part of application No. 14/472,719, filed on Aug. 29, 2014.

(51) Int. Cl.
*G01R 31/34* (2006.01)

(52) U.S. Cl.
CPC ........... *G01R 31/343* (2013.01); *F01P 2025/66* (2013.01); *F01P 2050/22* (2013.01)

(58) Field of Classification Search
CPC ..................................................... H02P 7/2913
See application file for complete search history.

(56) References Cited

U.S. PATENT DOCUMENTS

| | | | |
|---|---|---|---|
| 6,236,175 B1 * | 5/2001 | Mourad ..................... | H02P 6/18 318/268 |
| 6,384,553 B1 | 5/2002 | Liu | |
| 6,972,539 B1 | 12/2005 | Codilian | |
| 7,205,737 B1 * | 4/2007 | Bilodeau .............. | H02H 7/0833 318/431 |
| 8,157,536 B2 | 4/2012 | Teng | |
| 8,947,031 B1 | 2/2015 | Diamond | |
| 2002/0003381 A1 | 1/2002 | Nelson | |
| 2005/0237011 A1 | 10/2005 | Woods | |
| 2008/0310967 A1 | 12/2008 | Franz | |
| 2012/0104981 A1 | 5/2012 | Tseng | |
| 2012/0153880 A1 * | 6/2012 | Cerrato ................... | H02P 7/285 318/369 |
| 2012/0316711 A1 * | 12/2012 | Christian .............. | H01L 23/473 701/22 |
| 2013/0076286 A1 | 3/2013 | Patton | |
| 2013/0172060 A1 * | 7/2013 | Keating ............... | A63H 17/395 463/6 |
| 2013/0314017 A1 | 11/2013 | Sanchez | |
| 2014/0044149 A1 * | 2/2014 | Matsuura ............... | G01K 7/427 374/145 |
| 2014/0055064 A1 * | 2/2014 | Ng .......................... | H02P 6/182 318/400.11 |
| 2014/0265967 A1 | 9/2014 | Brown | |

* cited by examiner

*Primary Examiner* — Shawki S Ismail
*Assistant Examiner* — Muhammad S Islam
(74) *Attorney, Agent, or Firm* — Patent Law Office of David G. Beck

(57) ABSTRACT

A method is provided for testing the performance of a vehicle-mounted heat exchanger and determining whether debris is preventing air from efficiently passing through the heat exchanger. To test performance, after the vehicle is traveling faster than a preset minimum speed, the power to the DC fan motor that is adjacent to the heat exchanger is interrupted and the back EMF of the motor is used to determine fan motor speed. As rotation of the unpowered fan motor is due to the air flowing through the heat exchanger, the rate of fan rotation is used to indicate the relative health of the heat exchanger. If the rotation of the fan motor indicates insufficient air flow, then a notification message (e.g., visual or auditory warning indicator) is transmitted. If the test indicates sufficient air flow, normal operation of the fan motor is re-initiated and power is re-connected to the motor.

20 Claims, 4 Drawing Sheets

METHOD OF DIAGNOSING A BLOCKED HEAT EXCHANGER

CROSS-REFERENCE TO RELATED APPLICATION

This application is a continuation-in-part of U.S. patent application Ser. No. 14/472,719, filed 29 Aug. 2014, the disclosure of which is incorporated herein by reference for any and all purposes.

FIELD OF THE INVENTION

The present invention relates generally to a vehicle-mounted heat exchanger and, more particularly, to a method of determining when debris or other trapped contaminants are preventing efficient air flow through the heat exchanger.

BACKGROUND OF THE INVENTION

A DC motor-driven fan is a relatively simple and well-known mechanism used to circulate air. In common applications, the fan blows the air through a heat exchanger, such as a radiator, condenser or evaporator. The air that flows through the heat exchanger may be used as a source of heating or cooling, for example in a car's heating, ventilation and air conditioning (HVAC) system or in regulating the temperature of a car's engine, motor, or battery pack. Unfortunately, when the heat exchanger becomes blocked, for example by debris and other contaminants, air cannot flow efficiently through the heat exchanger. As a result, the components and subsystems utilizing the heat exchanger may operate improperly and/or overheat and become damaged. Accordingly, what is needed is a system that allows the heat exchanger to be periodically checked to insure proper operation. The present invention provides such a system.

SUMMARY OF THE INVENTION

The present invention provides a method of verifying the performance of a vehicle-mounted heat exchanger (e.g., radiator, condenser, evaporator) where the heat exchanger is exposed to ambient air flow when the vehicle is in motion and in which a DC fan motor is mounted in a position adjacent to the heat exchanger. The method includes the steps of (i) monitoring vehicle speed and (ii) comparing the vehicle speed to a preset vehicle speed. When the vehicle speed exceeds the preset vehicle speed, the method includes the steps of (i) temporarily disconnecting the power source from the DC fan motor, where the DC motor controller disconnects the power source; (ii) measuring the back electromotive force (BEMF) of the DC fan motor; (iii) calculating an actual motor speed from the BEMF; and (iv) comparing the actual motor speed to a minimum acceptable motor speed, wherein if the actual motor speed is less than the minimum acceptable motor speed the DC motor controller performs a first operation, and wherein if the actual motor speed is greater than the minimum acceptable motor speed the DC motor controller performs a second operation, where the first operation comprises transmitting a diagnostic message, and where the second operation comprises re-initiating normal operation of the DC fan motor and re-connecting the power source to the DC fan motor. The method may further include the step of waiting for a preset period of time after completing the step of temporarily disconnecting the power source from the DC fan motor before performing the step of measuring the BEMF. The step of transmitting a diagnostic message may include the step of the step of activating an on-board warning indicator and/or transmitting the diagnostic message over a service interface. The first operation may include the step of deactivating the DC fan motor, for example until the heat exchanger is repaired.

In another aspect, when the vehicle speed exceeds the preset vehicle speed, the method may further include the step of comparing the vehicle speed to a second preset speed, where the steps of temporarily disconnecting the power source, measuring the BEMF, calculating the actual motor speed, and comparing the actual motor speed to the minimum acceptable motor speed are only performed when the vehicle speed exceeds the preset vehicle speed and is less than the second preset vehicle speed.

The method may further comprise the step of monitoring the total operational time of the DC fan motor, where the steps of (i) temporarily disconnecting the power source from the DC fan motor, (ii) measuring the BEMF, (iii) calculating the actual motor speed, and (iv) comparing the actual motor speed to the minimum acceptable motor speed are performed (i) when the vehicle speed exceeds the preset vehicle speed and when the total operational time reaches a preset value, or (ii) when the vehicle speed exceeds the preset vehicle speed and is less than the second preset vehicle speed and when the total operational time reaches a preset value.

The method may further comprise the step of tracking the total number of use cycles for the DC fan motor, where the steps of (i) temporarily disconnecting the power source from the DC fan motor, (ii) measuring the BEMF, (iii) calculating the actual motor speed, and (iv) comparing the actual motor speed to the minimum acceptable motor speed are performed (i) when the vehicle speed exceeds the preset vehicle speed and when the total operational time reaches a preset value, or (ii) when the vehicle speed exceeds the preset vehicle speed and is less than the second preset vehicle speed and when the total operational time reaches a preset value.

The method may further comprise the step of tracking the total number of miles traveled by the vehicle, where the steps of (i) temporarily disconnecting the power source from the DC fan motor, (ii) measuring the BEMF, (iii) calculating the actual motor speed, and (iv) comparing the actual motor speed to the minimum acceptable motor speed are performed (i) when the vehicle speed exceeds the preset vehicle speed and when the total operational time reaches a preset value, or (ii) when the vehicle speed exceeds the preset vehicle speed and is less than the second preset vehicle speed and when the total operational time reaches a preset value.

A further understanding of the nature and advantages of the present invention may be realized by reference to the remaining portions of the specification and the drawings.

BRIEF DESCRIPTION OF THE DRAWINGS

It should be understood that the accompanying figures are only meant to illustrate, not limit, the scope of the invention and should not be considered to be to scale.

DESCRIPTION OF THE SPECIFIC EMBODIMENTS

As used herein, the singular forms "a", "an" and "the" are intended to include the plural forms as well, unless the context clearly indicates otherwise. The terms "comprises", "comprising", "includes", and/or "including", as used herein, specify the presence of stated features, integers, steps, operations, elements, and/or components, but do not preclude the presence or addition of one or more other features, integers, steps, operations, elements, components, and/or groups thereof. As used herein, the term "and/or" and the symbol "/" are meant to include any and all combinations of one or more of the associated listed items. Additionally, while the terms first, second, etc. may be used herein to describe various steps or calculations, these steps or calculations should not be limited by these terms, rather these terms are only used to distinguish one step or calculation from another. For example, a first calculation could be termed a second calculation, and, similarly, a first step could be termed a second step, without departing from the scope of this disclosure.

Figure 1:
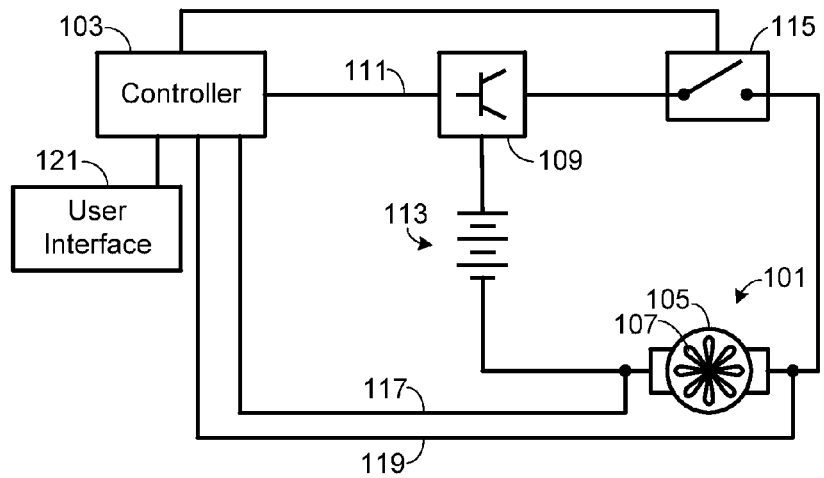
FIG. 1 provides a simplified circuit diagram of the sensor-less DC fan speed controller of the invention.

FIG. 1 provides a simplified diagram of a fan control circuit in accordance with the present invention. In this circuit, operation of DC fan motor assembly 101 is controlled by processor 103, where fan motor assembly 101 includes a DC motor 105 and a fan 107. Processor 103, also referred to herein as a controller, is typically comprised of a microprocessor or a programmable logic device. Processor 103 may be a stand-alone controller or integrated into another control system, such as the system controller used in a car's vehicle management system.

Typically fan motor assembly 101 is used with a heat exchanger, not shown, such as a radiator, condenser or evaporator. The heat exchanger may be mounted in a car where it may be used in combination with a thermal management system to cool a car system such as the battery pack in an electric or hybrid car, or the engine in a conventional vehicle. A car-mounted heat exchanger may also be used in combination with the car's heating, ventilation and air-conditioning (HVAC) system in order to provide temperature control over the passenger cabin. Typically if the heat exchanger is used in a car, it is mounted such that normal air flow during forward motion of the car will lead to air flowing through the heat exchanger. The heat exchanger may also be used in a non-vehicular system, for example to cool the CPU, GPU or other component within a computer. It should be understood that fan motor assembly 101 may also be used in applications where a heat exchanger is unnecessary. For example, the fan motor assembly 101 may be used to draw air into, or exhaust air out of, a confined area such as a computer case. In such applications in which fan motor assembly 101 is not used with a heat exchanger, the fan motor assembly may be used to force air through an air filter.

In order to provide the desired level of control over the speed of motor 105, preferably a pulse-width modulation (PWM) circuit 109 is used, where the control signal over line 111 for PWM circuit 109 is provided by controller 103. PWM circuit 109 may be included within, or be separate from, controller 103. As PWM circuits are well known by those of skill in the art, further detail is not provided herein.

The power source 113 used with motor 105 depends upon the application. In a car-mounted system, power source 113 is typically the battery/battery pack mounted within the vehicle, although at times the car may be plugged into a wall power outlet, for example during the charge cycle of an electric car, thus providing an alternative power source. In non-vehicular applications, for example a desktop computer in which the computer is plugged into a wall power outlet, power source 113 is generally the power grid. In some applications power source 113 includes a power conditioning system, e.g., a transformer, voltage regulator, etc.

During normal use, controller 103 closes switch 115 and provides PWM control signals to PWM circuit 109 over line 111. Fan speed, as controlled by PWM circuit 109 and controller 103, preferably utilizes an adaptive, open-loop feed-forward control system. The feed-forward aspect of this control system is well known and commonly used in a variety of fan controllers. In such a system, the PWM control signal provided over line 111 is correlated with motor speed. The correlation between motor speed and the PWM control signal may be obtained when the system is manufactured by performing a series of system characterization tests. Alternately, the correlation between motor speed and the PWM control signal may be based on an average taken from the characterization of multiple fan assemblies of the same design. Alternately, the correlation between the motor speed and the PWM control signal may be based on a model.

In addition to correlating motor speed to the PWM input control signal, the motor speed is preferably correlated with one or more characteristics of the system in which the fan assembly is to be used, thus allowing the correct motor speed to be selected for a specific set of conditions. For example, if fan assembly 101 is integrated into a vehicle, the fan speed may be correlated with vehicle speed, thus taking into account air flow that results from vehicle motion. The speed of the motor in a vehicle-mounted system may also take into account other conditions as well, conditions such as ambient temperature and/or the temperature of the component(s) that is coupled to the system's heat exchanger. If fan assembly 101 is integrated into a non-vehicular system such as a computer, fan speed may be correlated with the temperature of the component to be cooled (e.g., CPU, GPU) or the system to be cooled (e.g., internal case temperature), although it may also be correlated with ambient air temperature, air flow, or other relevant variable.

While varying fan speed by controlling the PWM signal using a feed-forward system is well known, this approach does not take into account changes in the system that may result from system wear and aging. For example, in a fan motor assembly it is typical to observe degradation in the performance of the bearing assemblies over time, both due to contaminants entering into the assemblies as well as normal wear. As a result of this aging process, even if the fan assembly is well calibrated immediately after it is manufactured, over time it will fall out of calibration, leading to the actual fan speeds being different from those desired. One approach to overcoming this problem is to correlate fan speed with predicted performance over time. Unfortunately, while this approach may help to compensate for fan assembly aging, since each fan assembly ages differently, this approach only provides a partial solution to the problem.

Accordingly, the present invention is designed to adapt to current conditions, including fan assembly wear, thereby allowing an appropriate PWM control signal to be selected that will provide the desired fan speed. In order to adapt the control signal to changing conditions, actual fan speed is monitored. To obtain actual fan speed, periodically controller 103 opens switch 115, thereby disconnecting motor 105 from power source 113. While motor 105 is temporarily in the powered-down state, the actual speed of motor 105 is acquired using signal lines 117/119. As the actual fan speed can be determined quite rapidly, switch 115 is only required to be open for a very short period of time, typically on the order of 100 milliseconds or less. As a result, any drop in fan speed due to the momentary interruption of power to the motor is imperceptible.

In order to measure actual fan speed, the back electromotive force (i.e., back EMF or BEMF) is measured over signal lines 117/119. This approach offers distinct advantages over a conventional motor speed monitoring system, such as those using Hall sensors, both in terms of cost and system complexity. The back EMF, which is generated as the rotor turns through the magnetic field generated by the motor's permanent magnet, is directly proportional to the speed of the motor, $\omega_m$, as well as the motor's voltage constant, $k_v$ (i.e., BEMF=$k_v\omega_m$). Note that the constant $k_v$ is often referred to as the back EMF constant.

Accordingly, in the present system when the power to the motor is interrupted by opening switch 115, the voltage generated by the motor, and observed over signal lines 117/119, is read and used to calculate the actual speed of the motor. Note that the voltage generated by the motor, i.e., the back EMF, is preferably not measured immediately, rather it is measured after a short delay, on the order of a few milliseconds, in order to allow the back EMF to stabilize after the charge stored in the inductance of the motor windings is lost. Using the measured voltage and the motor's voltage constant, $k_v$, the actual speed of the motor is determined. This speed is then compared to the expected speed that is based on the current PWM control signal and the look-up table used by the system to select PWM control signals based on the current operating conditions (e.g., ambient temperature, coolant temperature within the heat exchanger, air flow, temperature of the components coupled to the heat exchanger or otherwise cooled/heated by the fan assembly, etc.). If the actual speed and the expected speed are different, then the look-up table is modified, thereby insuring that even as the fan motor ages, the actual fan speed provided by fan motor 105 will match the desired fan speed as determined by the control system for a particular set of conditions.

Figure 2:
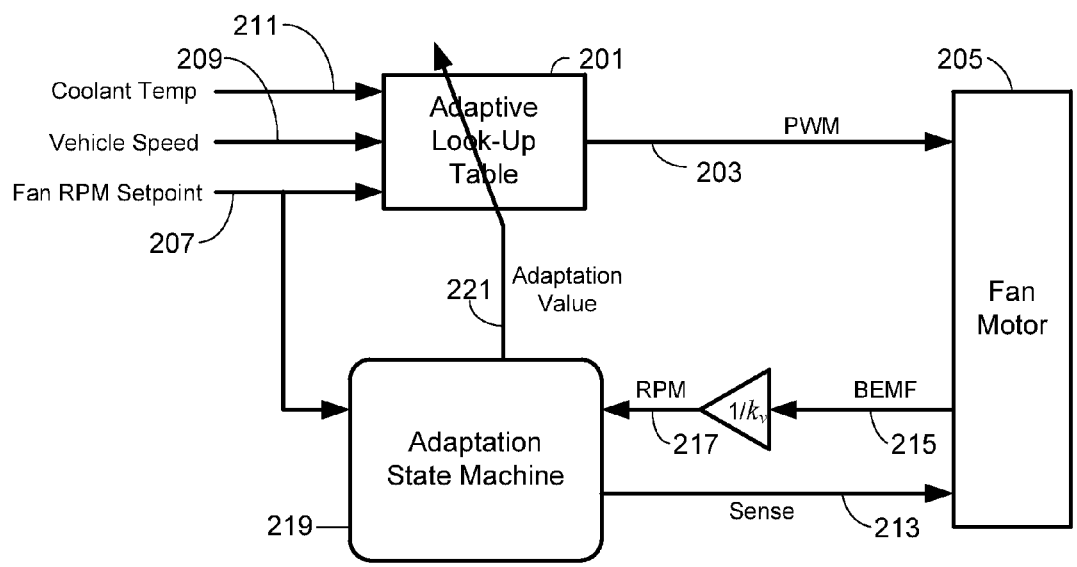
FIG. 2 provides a block diagram of the control strategy used with the system shown in FIG. 1.

FIG. 2 provides a block diagram of the control strategy used with the present system. As shown and as described above, a look-up 201 sets the PWM control signal supplied via control line 203 to fan motor 205. Look-up table 201 sets the PWM control signal based on the fan RPM setpoint 207. Typically look-up table 201 bases the selection of the PWM control signal on other system conditions as well, conditions such as the vehicle speed 209 which, assuming a common configuration for a vehicle-mounted system, will impact air flow through the fan motor assembly 101. Look-up table 201 may additionally base the selection of the PWM control signal, and thus the motor speed, on other current conditions such as coolant temperature 211 (or ambient temperature, or component/subsystem temperature, etc.).

Periodically the system sends a sense signal 213 which temporarily interrupts power to fan motor 205, thus allowing the current BEMF 215 to be measured. This voltage is then translated to an RPM value 217 by multiplying the BEMF by $1/k_v$. Adaptation state machine 219 compares the measured RPM 217 with RPM setpoint 207 to determine if the actual fan motor speed and the desired fan motor speed are different. If the two values are different, state machine 219 provides an adaptation value 221 to look-up table 201, thereby correcting for this error.

As described in detail above, as the motor in a fan assembly ages it eventually begins to rotate at a slower speed then expected for a given input signal, the decrease typically due to increased friction in the bearing assemblies. If the motor is not serviced or replaced, eventually it will seize. During the initial stages of this problem, as the motor becomes less efficient, the overall performance of the system becomes less efficient both in terms of the amount of energy required to drive the fan motor at a particular speed and the air flow generated by the corresponding fan for a given input signal. While the system described above relative to FIGS. 1 and 2 can be used to compensate for this aging effect, it does not provide the user or service personnel with any notice regarding the diminishing performance of the motor. As a result, the user may be completely unaware of the problem until the system cooled by the fan assembly overheats due to the fan motor seizing. Accordingly, in addition to utilizing the back EMF to correct the fan speed when the actual fan speed is different from the expected fan speed, the present system also uses the back EMF to diagnose fan motor problems.

Figure 3:
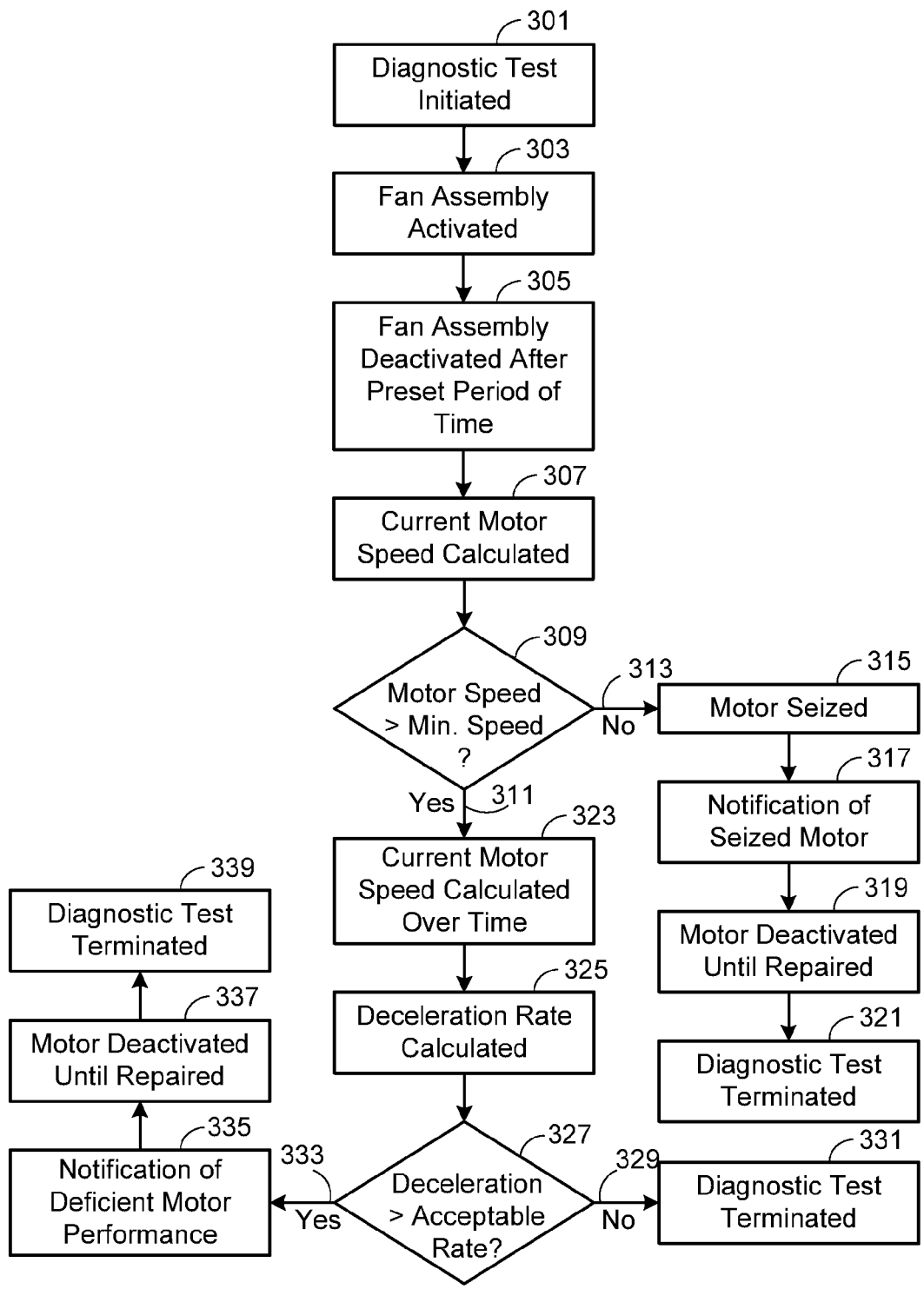
FIG. 3 illustrates the methodology associated with at least one embodiment in which back EMF is used to diagnose fan motor performance.

In accordance with at least one embodiment of the invention, and as illustrated in FIG. 3, periodically a performance test is run on fan motor assembly 101 in order to determine if the assembly is performing within specifications, and if it is not, to notify a user or other party (e.g., service technician, vehicle manufacturer, vehicle dealer, etc.) of the problem. The diagnostic test may be run each time the system utilizing the fan assembly is turned on; alternately, the test may be performed periodically based on the total amount of time that the fan assembly has been in use since the last diagnostic test was performed; alternately, the test may be performed periodically based on the total number of times that the fan assembly has been activated; alternately, in a vehicle-mounted system the test may be performed periodically based on the number of miles the car has been driven since the last diagnostic test was performed; alternately, the diagnostic test may be performed upon command, where the test may be initiated by the user, a service technician or other party.

Once a fan assembly diagnostic test is initiated (step 301), the fan motor is turned on (step 303) and allowed to run for a preset period of time before being turned off (step 305). After the fan assembly 101 is turned off, the current motor speed is determined utilizing a back EMF measurement as described above (step 307). As previously noted, typically the back EMF measurement is made after the conclusion of a very brief delay, on the order of a few milliseconds, in order to allow the back EMF to stabilize after the charge stored in the inductance of the motor windings is lost.

The current motor speed, as determined after the motor has been activated for a brief period of time, is then compared to a preset minimum motor speed (step 309). If the current motor speed is greater than the preset speed (step 311) then the motor is deemed to have passed the first portion of the diagnostic test. If the current motor speed is less than the preset minimum motor speed (step 313), then the motor is assumed to be seized (step 315) or otherwise blocked from performing normally. Notification of the seized/blocked motor is provided (step 317) and preferably future activation of the motor is prevented (step 319) until the motor has been repaired or replaced, thus preventing overheating and the potential problems that may arise due to a seized, overheated motor (e.g., fire). The diagnostic test is then terminated (step 321). Preferably if the diagnostic test is initiated by the user, or performed during normal operation of the system (e.g., routine diagnostic test performed during system start-up), then the notification provided in step 317, which may be either auditory or visual, is provided over a user interface 121. If a visual warning is provided, it may be as simple as an indicator that lights up on the instrument cluster or a warning displayed on a flat panel display. Preferably if the diagnostic test is initiated by a service technician, the notification provided in step 317 is a diagnostic message provided over a service interface.

If the current motor speed is greater than the preset speed (step 311) then preferably the current motor speed is monitored over time (step 323) using back EMF, thus allowing the rate of deceleration to be determined (step 325). The rate of deceleration is then compared to an acceptable rate of deceleration (step 327). If the observed rate of deceleration is less than the acceptable rate (step 329), then the diagnostic test is terminated (step 331) and the fan assembly is deemed to be performing within an acceptable performance range. If the observed rate of deceleration is greater than the acceptable rate (step 333), then notification of the failed performance test is provided (step 335). As with the motor seizure test, preferably if the diagnostic test is initiated by the user or performed during normal system operation of the system, then the notification is provided (either auditory or visual) over user interface 121. Preferably if the diagnostic test is initiated by a service technician, the notification provided in step 335 is a diagnostic message provided over a service interface. Note that in some embodiments, and preferably depending upon the observed rate of deceleration, future activation of the motor is prevented (step 337) until the motor has been repaired or replaced, thus preventing complete seizure of the motor and the accompanying overheating of the assembly. The diagnostic test is then terminated (step 339).

As previously noted, fan assembly 101 may be used with a heat exchanger (e.g., radiator, condenser, evaporator) and mounted within a vehicle, where the fan assembly is used to augment air flow when the car is parked or moving too slowly to provide the desired level of air flow through the heat exchanger. In such an application, as the fan motor ages, the fan may turn at a rate different from the desired rate, or stop altogether (i.e., seize-up). As described in detail above, the present invention may be used to compensate for this aging effect, as well as monitor motor health. Additionally, the invention may be used to diagnose the health of the heat exchanger, specifically the ability for air to flow through the heat exchanger. As a result, a clogged heat exchanger may be detected before the lack of air flow leads to the system(s) utilizing the heat exchanger to overheat and become damaged.

Figure 4:
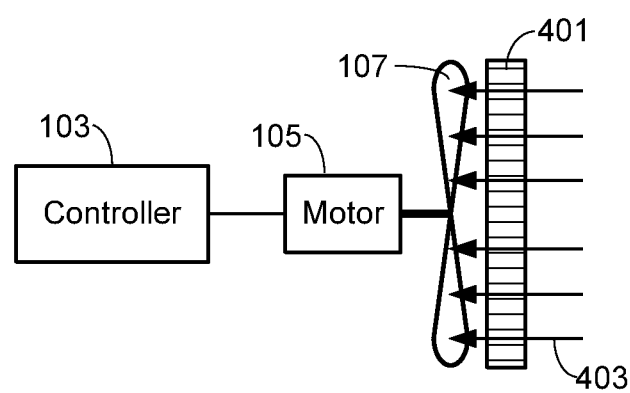
FIG. 4 illustrates the fan configuration used to diagnose heat exchanger performance.
Figure 5:
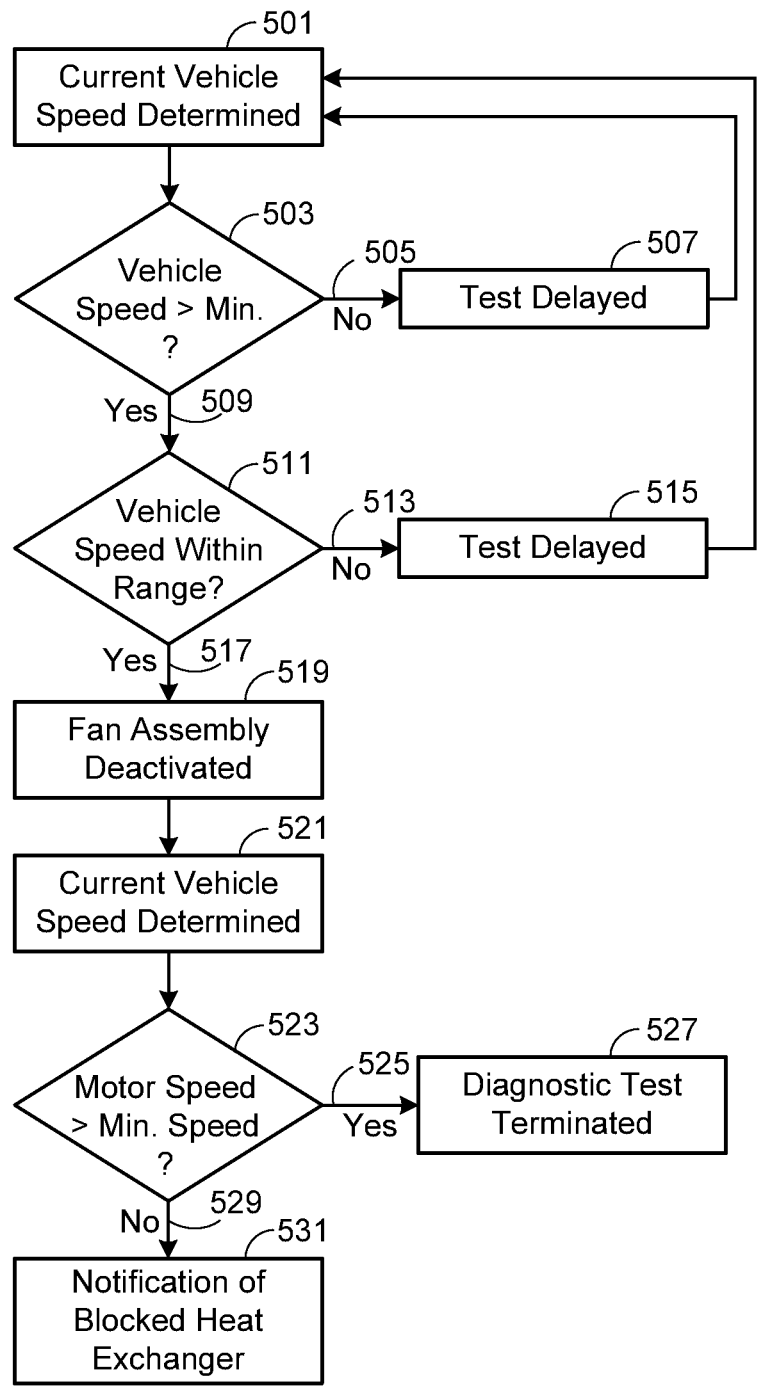
FIG. 5 illustrates the methodology associated with at least one embodiment in which back EMF is used to diagnose heat exchanger performance.

In accordance with at least one embodiment of the invention, and as illustrated in FIGS. 4 and 5, periodically a performance test is run to determine that the rate of air flow through the heat exchanger is within the preset system specifications, and if it is not, to notify a user or other party (e.g., service technician, vehicle manufacturer, vehicle dealer, etc.) of the problem. The diagnostic test may be run each time the vehicle is in motion and traveling at the required speed; alternately, the test may be performed when the vehicle is in motion and traveling at the required speed and based on the total amount of time that the fan assembly has been in use since the last diagnostic test was performed; alternately, the test may be performed when the vehicle is in motion and traveling at the required speed and based on the total number of times that the fan assembly has been activated since the last diagnostic test was performed; alternately, the test may be performed when the vehicle is in motion and traveling at the required speed and based on the number of miles the car has been driven since the last diagnostic test was performed; alternately, the diagnostic test may be performed upon command, where the test may be initiated by the user, a service technician or other party.

In order to test heat exchanger performance, and specifically test the heat exchanger to determine if debris or other contaminants are blocking efficient air flow, the speed of fan 107 is monitored when the vehicle is in motion and with power to the fan interrupted. Prior to performing this diagnostic test, the vehicle must be traveling at a speed greater than a preset speed, and preferably a speed that falls within a preset range. Accordingly, the first step in performing this test is to determine the vehicle speed (step 501), and then compare that speed to a preset minimum (step 503). If the vehicle speed is too low (step 505), the test is delayed (step 507).

Once the speed of the vehicle is greater than the minimum (step 509), then the system preferably determines if the vehicle speed is relatively constant, i.e., that it falls within a preset range (step 511). If the vehicle speed does not fall within the preset range (step 513), the test is delayed (step 515). If the vehicle speed does fall within the preset range (step 517), then power to the fan assembly is interrupted (step 519) and the current motor speed is determined utilizing a back EMF measurement as described above (step 521). As previously noted, typically the back EMF measurement is made after the conclusion of a very brief delay, on the order of a few milliseconds, in order to allow the back EMF to stabilize after the charge stored in the inductance of the motor windings is lost.

The current motor speed is then compared to a preset minimum motor speed (step 523). If heat exchanger 401 is not blocked, the air flowing through the heat exchanger in direction 403 due to the forward motion of the car will cause fan 107 to turn at a rate greater than the preset minimum (step 525). If the motor speed is determined to be greater than the preset speed (step 525) then the heat exchanger is deemed to be unblocked and the diagnostic test is terminated (step 527). If the current motor speed is less than the preset minimum motor speed (step 529), then it is assumed that the heat exchanger has become blocked by debris, although it is possible that the motor has become seized. At this point, notification of the blocked heat exchanger is provided (step 531). Preferably if the diagnostic test is initiated by the user, or performed during normal operation of the vehicle (e.g., routine diagnostic test performed while traveling at sufficient speed), then the notification (either auditory or visual) provided in step 531 is provided over user interface 121. As noted above, if a visual warning is provided, it may be a dash-mounted warning light or a warning displayed on a display mounted within the passenger cabin. Preferably if the diagnostic test is initiated by a service technician, the notification provided in step 531 is a diagnostic message provided over a service interface. Preferably if the motor speed is too low (step 529), the system is configured to run the diagnostic described above relative to FIG. 3, thus insuring that the problem is with heat exchanger blockage rather than a seized motor.

Systems and methods have been described in general terms as an aid to understanding details of the invention. In some instances, well-known structures, materials, and/or operations have not been specifically shown or described in detail to avoid obscuring aspects of the invention. In other instances, specific details have been given in order to provide a thorough understanding of the invention. One skilled in the relevant art will recognize that the invention may be embodied in other specific forms, for example to adapt to a particular system or apparatus or situation or material or component, without departing from the spirit or essential characteristics thereof. Therefore the disclosures and descriptions herein are intended to be illustrative, but not limiting, of the scope of the invention.

What is claimed is:

1. A method of verifying performance of a heat exchanger, wherein the heat exchanger is mounted within a vehicle, wherein the heat exchanger is exposed to ambient air flow when the vehicle is in motion, and wherein a DC fan motor is mounted in a position adjacent to the heat exchanger, the method comprising the steps of:
monitoring a vehicle speed corresponding to said vehicle;
comparing said vehicle speed to a preset vehicle speed, wherein when said vehicle speed exceeds said preset vehicle speed the method further comprises the steps of:
temporarily disconnecting a power source from said DC fan motor, wherein said step of temporarily disconnecting said power source is performed by a DC motor controller;
measuring a back electromotive force (BEMF) of said DC fan motor;
calculating an actual motor speed from said BEMF; and
comparing said actual motor speed to a minimum acceptable motor speed, wherein if said actual motor speed is less than said minimum acceptable motor speed said DC motor controller performs a first operation, and wherein if said actual motor speed is greater than said minimum acceptable motor speed said DC motor controller performs a second operation, wherein said first operation is comprised of the step of transmitting a diagnostic message, and wherein said second operation is comprised of the steps of re-initiating a normal operation for said DC fan motor and re-connecting said power source to said DC fan motor.

2. The method of claim 1, further comprising the step of waiting for a preset period of time after completing said step of temporarily disconnecting said power source from said DC fan motor before performing said step of measuring said BEMF of said DC fan motor.

3. The method of claim 1, wherein said step of transmitting said diagnostic message further comprises the step of activating an on-board warning indicator.

4. The method of claim 1, wherein said step of transmitting said diagnostic message further comprises the step of transmitting said diagnostic message over a service interface.

5. The method of claim 1, wherein said first operation further comprises the step of deactivating said DC fan motor.

6. The method of claim 1, further comprising the step of monitoring a total operational time of said DC fan motor, wherein said steps of temporarily disconnecting said power source, measuring said BEMF, calculating said actual motor speed, and comparing said actual motor speed to said minimum acceptable motor speed are performed when said vehicle speed exceeds said preset vehicle speed and said total operational time reaches a preset value.

7. The method of claim 1, further comprising the step of tracking a total number of use cycles for said DC fan motor, wherein said steps of temporarily disconnecting said power source, measuring said BEMF, calculating said actual motor speed, and comparing said actual motor speed to said minimum acceptable motor speed are performed when said vehicle speed exceeds said preset vehicle speed and said total number of use cycles reaches a preset value.

8. The method of claim 1, wherein said method further comprises the step of tracking a total number of miles traveled by said vehicle, wherein said steps of temporarily disconnecting said power source, measuring said BEMF, calculating said actual motor speed, and comparing said actual motor speed to said minimum acceptable motor speed are performed when said vehicle speed exceeds said preset vehicle speed and said total number of miles traveled by said vehicle exceeds a preset value.

9. The method of claim 1, wherein said heat exchanger is selected from the group consisting of radiators, condensers and evaporators.

10. The method of claim 1, wherein when said vehicle speed exceeds said preset vehicle speed the method further comprises the steps of:
comparing said vehicle speed to a second preset vehicle speed, wherein the steps of temporarily disconnecting said power source, measuring said BEMF, calculating said actual motor speed, and comparing said actual motor speed to said minimum acceptable motor speed are only performed when said vehicle speed exceeds said preset vehicle speed and is less than said second preset vehicle speed.

11. The method of claim 5, wherein said step of deactivating said DC fan motor is performed until said heat exchanger is repaired.

12. The method of claim 10, further comprising the step of waiting for a preset period of time after completing said step of temporarily disconnecting said power source from said DC fan motor before performing said step of measuring said BEMF of said DC fan motor.

13. The method of claim 10, wherein said step of transmitting said diagnostic message further comprises the step of activating an on-board warning indicator.

14. The method of claim 10, wherein said step of transmitting said diagnostic message further comprises the step of transmitting said diagnostic message over a service interface.

15. The method of claim 10, wherein said first operation further comprises the step of deactivating said DC fan motor.

16. The method of claim 11, further comprising the step of monitoring a total operational time of said DC fan motor, wherein said steps of temporarily disconnecting said power source, measuring said BEMF, calculating said actual motor speed, and comparing said actual motor speed to said minimum acceptable motor speed are performed when said vehicle speed exceeds said preset vehicle speed and is less than said second preset vehicle speed and when said total operational time reaches a preset value.

17. The method of claim 10, further comprising the step of tracking a total number of use cycles for said DC fan motor, wherein said steps of temporarily disconnecting said power source, measuring said BEMF, calculating said actual motor speed, and comparing said actual motor speed to said minimum acceptable motor speed are performed when said vehicle speed exceeds said preset vehicle speed and is less than said second preset vehicle speed and when said total number of use cycles reaches a preset value.

18. The method of claim 10, wherein said method further comprises the step of tracking a total number of miles traveled by said vehicle, wherein said steps of temporarily disconnecting said power source, measuring said BEMF, calculating said actual motor speed, and comparing said actual motor speed to said minimum acceptable motor speed are performed when said vehicle speed exceeds said preset vehicle speed and is less than said second preset vehicle speed and when said total number of miles traveled by said vehicle exceeds a preset value.

19. The method of claim 10, wherein said heat exchanger is selected from the group consisting of radiators, condensers and evaporators.

20. The method of claim 15, wherein said step of deactivating said DC fan motor is performed until said heat exchanger is repaired.

\* \* \* \* \*